(12) United States Patent
Yan et al.

(10) Patent No.: US 11,283,351 B2
(45) Date of Patent: Mar. 22, 2022

(54) LOAD TRANSIENT CONTROL FOR SWITCHED MODE CONVERTER

(71) Applicant: Analog Devices, Inc., Norwood, MA (US)

(72) Inventors: Yingyi Yan, Fremont, CA (US); Yiding Gu, Pleasanton, CA (US)

(73) Assignee: Analog Devices, Inc., Norwood, MA (US)

( * ) Notice: Subject to any disclaimer, the term of this patent is extended or adjusted under 35 U.S.C. 154(b) by 22 days.

(21) Appl. No.: 16/906,519

(22) Filed: Jun. 19, 2020

(65) Prior Publication Data

US 2021/0376730 A1 Dec. 2, 2021

Related U.S. Application Data

(60) Provisional application No. 63/030,032, filed on May 26, 2020.

(51) Int. Cl.
   *H02M 3/158* (2006.01)
   *H02M 3/156* (2006.01)
   *H02M 1/00* (2006.01)

(52) U.S. Cl.
   CPC ....... *H02M 3/1566* (2021.05); *H02M 1/0016* (2021.05); *H02M 3/1584* (2013.01); *H02M 1/0025* (2021.05)

(58) Field of Classification Search
   CPC ............ H02M 3/1566; H02M 1/0016; H02M 1/0003; H02M 1/0006; H02M 1/0032; H02M 3/1584; H02M 3/158
   See application file for complete search history.

(56) References Cited

U.S. PATENT DOCUMENTS 6,229,292 B1   5/2001  Redl et al.
6,366,070 B1   4/2002  Cooke et al.
                (Continued)

FOREIGN PATENT DOCUMENTS

KR      100831746      5/2008

OTHER PUBLICATIONS

Huang, Wenkang, "A New Control for Multi-phase Buck Converter with Fast Transient Response", 16th Annual IEEE Applied Power Electronics Conference and Exposition (APEC), Anaheim, CA, USA, (2001), 7 pgs.

*Primary Examiner* — Alex Torres-Rivera
(74) *Attorney, Agent, or Firm* — Schwegman Lundberg & Woessner, P.A.

(57) ABSTRACT

This disclosure describes techniques to control switching operations of a switching regulator. The disclosure includes a system comprising a switching regulator configured to use an inductor to generate an output voltage signal from a. pulse-width-modulated (PWM) signal by controlling one or more switches of the switching regulator that vary charging operations of the inductor; transient handling circuitry coupled to receive a feedback voltage based on the output voltage signal and configured to generate first and second current signals that represent a difference between the feedback voltage and a reference voltage; and control circuitry configured to generate the PWM signal based on the first and second current signals such that the first current signal changes a frequency of an oscillator used to generate the PWM signal and the second current signal changes a bandwidth of a feedback loop associated with the switching regulator.

20 Claims, 9 Drawing Sheets

(56) References Cited

U.S. PATENT DOCUMENTS

| | | | |
|---|---|---|---|
| 6,605,931 B2 | 8/2003 | Brooks | |
| 6,696,882 B1 | 2/2004 | Markowski et al. | |
| 7,782,027 B2 | 8/2010 | Williams | |
| 7,923,977 B2 | 4/2011 | Huang | |
| 7,948,720 B2 | 5/2011 | Mok et al. | |
| 8,368,375 B2 | 2/2013 | Liu et al. | |
| 8,593,123 B2 | 11/2013 | Chen et al. | |
| 8,928,303 B2 | 1/2015 | Zhu et al. | |
| 8,994,350 B2 | 3/2015 | Li | |
| 9,348,345 B2 | 5/2016 | Lynch et al. | |
| 9,525,344 B2 | 12/2016 | Chen | |
| 9,891,643 B2 | 2/2018 | El-nozahi et al. | |
| 10,135,336 B2 | 11/2018 | Li | |
| 10,211,729 B2 | 2/2019 | Duong et al. | |
| 10,511,234 B2 | 12/2019 | Zhang et al. | |
| 10,784,780 B1* | 9/2020 | Scandola | H02M 3/157 |
| 2005/0237037 A1* | 10/2005 | Xing | H02M 3/156 |
| | | | 323/268 |
| 2012/0119720 A1* | 5/2012 | Li | H02M 3/158 |
| | | | 323/284 |
| 2014/0266122 A1* | 9/2014 | Zhu | H02M 3/156 |
| | | | 323/284 |
| 2016/0294278 A1* | 10/2016 | Li | H02M 3/156 |
| 2018/0097449 A1* | 4/2018 | Kim | H02M 1/4225 |
| 2018/0120877 A1 | 5/2018 | Zhao | |
| 2020/0127566 A1* | 4/2020 | Lazaro | H02M 1/0061 |
| 2021/0099084 A1* | 4/2021 | Cheng | H02M 1/0061 |

\* cited by examiner

510 — GENERATE, USING AN INDUCTOR, AN OUTPUT VOLTAGE SIGNAL FROM A PULSE-WIDTH-MODULATED (PWM) INPUT VOLTAGE BY CONTROLLING ONE OR MORE SWITCHES OF A SWITCHING REGULATOR THAT VARY CHARGING OPERATIONS OF THE INDUCTOR

520 — GENERATE, BY TRANSIENT HANDLING CIRCUITRY, FIRST AND SECOND CURRENT SIGNALS THAT REPRESENT A DIFFERENCE BETWEEN A FEEDBACK VOLTAGE, GENERATED BASED ON THE OUTPUT VOLTAGE SIGNAL, AND A REFERENCE VOLTAGE

530 — CHANGE A FREQUENCY OF AN OSCILLATOR USED TO GENERATE THE PWM INPUT VOLTAGE AS A FUNCTION OF THE FIRST CURRENT SIGNAL AND CHANGE A BANDWIDTH OF A FEEDBACK LOOP ASSOCIATED WITH THE SWITCHING REGULATOR AS A FUNCTION OF THE SECOND CURRENT SIGNAL TO GENERATE THE PWM SIGNAL

*FIG. 5*

LOAD TRANSIENT CONTROL FOR SWITCHED MODE CONVERTER

CROSS-REFERENCE TO RELATED APPLICATION

This application claims the benefit of priority under 35 USC 119(e) of U.S. Provisional Patent Application No. 63/030,032, filed May 26, 2020, the contents of which are incorporated herein by reference in their entirety.

FIELD OF THE DISCLOSURE

This document pertains generally, but not by way of limitation, to switching regulators, and more particularly, to adaptive loop control of current-mode DC/DC converter systems.

BACKGROUND

Switching regulators typically use one or more switches (e.g., transistors) for alternately opening and closing a current path through a reactive element such as an inductor according to a particular frequency. In operation, electrical energy is transferred to one or more loads connected from the inductor by alternately opening and closing the switches periodically. The amount of electrical energy transferred to the loads is a function of the ratio of the time intervals at which the switches are opened and closed. Switching regulators that generate an output voltage lower than an input voltage are termed buck or step-down converters, and those that generate an output voltage higher than the input voltage are termed boost or step-up converters. Switching regulators are widely used for powering electronic devices, particularly battery-powered devices, such as portable cellular phones, laptop computers, and other electronic systems in which efficient use of power is desirable.

SUMMARY OF THE DISCLOSURE

In some certain embodiments, a system and method are provided for controlling switching operations of a switching regulator. The system may include a switching regulator configured to use an inductor to generate an output voltage signal from a pulse-width-modulated (PWM) input voltage by controlling one or more switches of the switching regulator that vary charging operations of the inductor; transient handling circuitry coupled to receive a feedback voltage based on the output voltage signal and configured to generate first and second current signals that represent a difference between the feedback voltage and a reference voltage; and control circuitry configured to generate the PWM signal based on the first and second current signals such that the first current signal changes a frequency of an oscillator used to generate the PWM signal and the second current signal changes a bandwidth of a feedback loop associated with the switching regulator.

In some implementations, the switching regulator comprises a peak current-mode control circuit, and after a load step-up event, the first current signal initially increases the frequency of the oscillator and gradually decreases the frequency of the oscillator as the feedback voltage reaches the reference voltage. On the other hand, after a load step-down event, the first current signal initially decreases the frequency of the oscillator and gradually increase the frequency of the oscillator as the feedback voltage falls back to the reference voltage.

In some implementations, the transient handling circuitry generates a third current signal based on the difference between the feedback voltage and a reference voltage, and the control circuitry is further configured to: convert the third current signal to a compensation voltage; compare the compensation voltage to a voltage sense signal representing the inductor current; and generate the PWM signal based on intersection between the compensation voltage and the voltage sense signal.

In some implementations, the second current signal is summed with the third current signal.

In some implementations, the control circuitry is further configured to: pass the second current signal during transient, and sum this current with the current derived from the first compensation voltage. The summed current generates a second compensation voltage to generate the PWM signal.

In some implementations, the control circuitry comprises a reset-set (RS) latch circuit, wherein an output of a current comparator that compares the second compensation voltage with the voltage sense signal is coupled to a reset input of the RS latch, and wherein the oscillator is coupled to a set input of the RS latch.

In some implementations, the control circuitry is further configured to generate an asynchronous pulse signal to control the PWM signal, the asynchronous pulse signal being generated based on a comparison between the feedback voltage and a second reference voltage.

In some implementations, the control circuitry comprises a rising edge detector to generate the asynchronous pulse signal.

In some implementations, a frequency signal generated based on the oscillator and the asynchronous pulse signal is coupled to a set input of the RS latch.

In some implementations, the frequency signal is generated based on an output of a logical OR circuit that logically combines the oscillator and the asynchronous pulse signal.

In some implementations, the first current signal is provided to a peak detector, and an output of the peak detector is used to change the frequency of the oscillator.

In some implementations, the switching regulator comprises a multiphase shared output converter, the PWM signal is a first PWM signal provided to the multiphase shared output converter, the control circuitry provides a second PWM signal to the multiphase shared output converter, and the first current signal increases the frequency of the oscillator used to generate the first and second PWM signals.

In some implementations, the control circuitry is further configured to generate an asynchronous pulse signal to concurrently set both the first and second PWM signals, the asynchronous pulse signal being generated based on a comparison between the feedback voltage and a second reference voltage.

This overview is intended to provide an overview of subject matter of the present patent application. It is not intended to provide an exclusive or exhaustive explanation of the inventive subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 is a flow diagram depicting example processes for controlling switching operations of a switching regulator in accordance with various embodiments.

DETAILED DESCRIPTION

Figure 1:
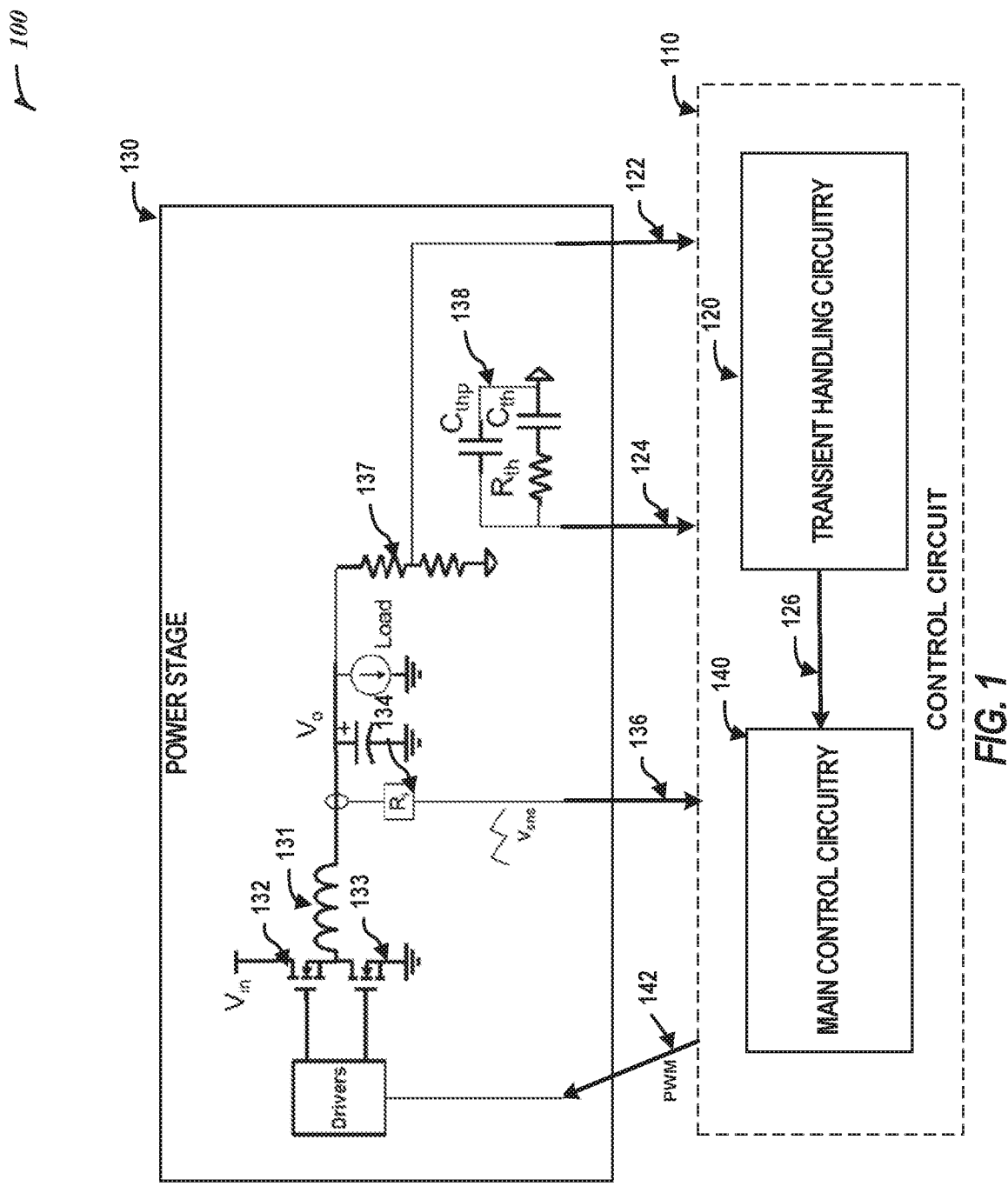
FIG. 1 is a block diagram of an example of a switching regulator system in accordance with various embodiments.

This disclosure describes, among other things, techniques to vary the switching frequency of a switching regulator that delivers voltages to an output channel based on a transient that appears on the channel.

Switched mode DC/DC converters have been popular in industry for many years. Generally speaking, the design of a switched mode DC/DC converter is a tradeoff between power conversion efficiency and solution size. A low-frequency switching converter provides higher efficiency due to less switching-related loss, but in order to meet a given transient response specification, the solution size may be larger. This is because the low switching frequency limits the control bandwidth, so that more output capacitors may be needed to store the required energy during a load transient. In the small signal transfer function Vo/ITH, there is only one low-frequency single pole contributed by the output capacitor. At high frequency, a double pole is at half of switching frequency. As system transfer function is a first-order transfer function, the closed loop bandwidth can be widened, and transient response can be improved, by increasing the gain factor of the error amplifier until the bandwidth is limited by half of the switching frequency double pole effect. The bandwidth is limited to about one-fifth of the switching frequency, or the sub-harmonic oscillation and noise can disturb the stable operation of the converter system.

Current-mode controlled DC/DC power converters are a category of switched mode DC/DC converters. The controller integrates the error between output voltage and regulation target and uses it as a current reference signal. The sensed inductor current signal is compared with the current reference signal to generate the pulsed width modulation (PWM) signal. Current-mode controls include fixed or constant frequency peak and valley current mode. These devices are turned. ON and OFF during each cycle at the fixed frequency of operation.

Because the current-mode controlled converter senses the current information, it can provide accurate protection against over-current conditions. For example, a constant frequency peak current-mode controlled architecture provides a natural current limit and is stable over a wide range of input and output conditions. It is also ideally suited for multiphase applications where current sharing and transient response is of greater importance. Further, current-mode converters are easy to compensate to insure a stable output when load conditions are stable, and therefore they are easy to use.

Typical current-mode converters include a compensation capacitor Cthp in a compensation network to attenuate high-frequency noise and reduce jittering in steady state. This capacitor provides a low-pass filtering effect but slows down the transient response of the typical current-mode converters and adversely impacts the closed-loop bandwidth of the current-mode converter. In addition to the transient response being slowed down and the adverse affects to the closed-loop bandwidth, the dock latency is another factor that limits the transient response of such circuits. In the case of constant frequency peak current-mode controlled converter, in certain situations, when the output load increases immediately after the control switch has just turned OFF, the converter has to wait for the next clock pulse to turn ON the control switch. For a sufficiently high-bandwidth converter, this clock latency can be a main reason for voltage drop during the transient response. Similar latency issues exist in the other current-mode architectures for different load transient conditions.

According to the disclosed embodiments, the disclosure describes a process of power conversion and a current-mode power conversion system constructed to provide a stable output voltage and a maximum-limited output current to a load. The disclosed system includes a feedback control operable in a steady mode for controlling the output current to the load during constant load conditions, and in a "turbo mode" for controlling the output current to the load during changes in load conditions. When a change in load conditions is detected, such as a transient on the load, the controller virtually changes the error amplifier transfer function, so the feedback control bandwidth of the turbo mode is higher than the steady mode. The switching frequency is higher than the steady mode, so as to speed up the response of the feedback control and dramatically reduce the voltage deviation under load transient.

Specifically, the disclosed system includes a switching regulator configured to use an inductor to generate an output voltage signal from a PWM signal by controlling one or more switches of the switching regulator that vary charging operations of the inductor. Transient handling circuitry is coupled to receive a feedback voltage based on the output voltage signal and is configured to generate first and second current signals that represent a difference between the feedback voltage and a reference voltage. Control circuitry is configured to generate the PWM signal based on the first and second current signals such that the first current signal increases a frequency of an oscillator (e.g., linearly increases the frequency) used to generate the PWM signal, and the second current signal changes (e.g., linearly) a bandwidth of a feedback loop associated with the switching regulator. In this way, the disclosed embodiments widen the closed-loop bandwidth of the switching circuit and improve the transient response.

FIG. 1 is a block diagram of an example of a switching regulator system 100 in accordance with various embodiments. The switching regulator system 100 includes a power stage 130 and a control circuit 110 which includes transient handling circuitry 120 and main control circuitry 140.

The switching regulator system 100 may be a current-mode (CM) DC/DC switching power supply, also known as a current-mode DC/DC converter. Many other converter configurations can also benefit from the present disclosure. The type of converter shown in FIG. 1 is a peak current-mode converter. An overview of the functionality of the power stage 130 is provided below. Although the disclosure is based on a buck converter with peak current-mode control, the disclosed concepts are similarly applicable to other converters and other current-mode control schemes. The power stage 130 includes a compensation network 138 (e.g., Rth, Cth, and Cthp) used to generate signal 124 and which can be any type of impedance network.

The compensation network 138, including Rth, Cth, and Cthp, is used to generate signal 124 and can be on-chip or off-chip and coupled to the power stage 130 and the control circuit 110.

During operation, the main control circuitry 140 turns ON and OFF switches 132 and 133 of the power stage 130 based on signals 136, 124, and 122 at a particular frequency to control current flowing to the output of the power stage 130, In one example, when the main control circuitry 140 turns ON one of the switches 132 or 133 of the power stage 130, an input voltage Vin is applied to an inductor 131 through the switch 132, or ground potential is applied to the inductor 131 via switch 133. When the switch 132 turns ON, the current ramps up and flows through the inductor 131. When the switch 133 turns ON, the current ramps down. This current flows through a current sensor 134 (e.g., current-sense circuitry) and generates a Vsns voltage signal 136.

The control circuit 110 receives a feedback voltage 122 through a voltage divider network 137 coupled to a terminal of the inductor 131. Specifically, the transient handling circuitry 120 receives the feedback voltage 122 and compares this feedback voltage 122 to a reference voltage to generate a current representing a difference between the feedback voltage 122 and the reference voltage. This signal 124 is fed into a compensation network 138 (e.g., that includes one or more resistors and capacitors), and the voltage signal across the compensation network 138 is fed to the main control circuitry 140.

The main control circuitry 140 generates a PWM signal 142 to turn ON or OFF the switches 132 and 133 of the power stage 130 based on an oscillator signal and signal 126. For example, the main control circuitry 140 may turn ON the switch 132 to charge the inductor 131 when the oscillator signal goes high. The main control circuitry 140 may turn ON a different one of the switches 132 and 133 to discharge the inductor 131 when the Vsns voltage signal 136 exceeds the voltage derived from the voltage across network 138.

In an embodiment, the transient handling circuitry 120 generates a plurality of current signals that represent a difference between the feedback voltage 122 and the reference voltage. A first of the current signals may be generated based on a first transconductance value of a transconductance amplifier of the transient handling circuitry 120 and a second of the current signals may be generated based on a second transconductance value of the transconductance amplifier of the transient handling circuitry 120. The main control circuitry 140 generates the PWM signal 142 based on the first and second current signals such that the first current signal changes a frequency of the oscillator used to generate the PWM signal 142 and the second current signal changes a bandwidth of a feedback loop associated with the switching regulator. For example, the first current signal is used to change the frequency of the oscillator while the second current signal is used to increase or change a current used to generate a voltage that is compared to the Vsns signal 136.

In some embodiments, the main control circuitry 140 generates an asynchronous pulse signal to control the PWM signal 142. The asynchronous pulse signal may be generated based on a comparison between the feedback voltage 122 and a second reference voltage. In some embodiments, the asynchronous pulse signal may be generated using a rising edge detector.

As an example, in the event of a transient event, the transient handling circuitry 120 generates a signal that indicates the transient event. The transient event may occur between two clock signals of the oscillator of the main control circuitry 140. The signal may cause the main control circuitry 140 to generate the asynchronous pulse to turn ON one of the switches 132 and 133 of power stage 130 so that the inductor 131 begins being charged before the next clock pulse is received from the oscillator. Concurrently, a current signal provided by the transient handling circuitry 120 may represent the amount by which the feedback voltage 122 below the reference voltage. Based on this amount, the frequency of the oscillator is changed (e.g., increased) and is gradually (linearly) decreased over time as the current signal indicates that the feedback voltage 122 starts to get closer to the reference voltage. Once the feedback voltage 122 matches the reference voltage, the frequency of the oscillator returns to steady-state operation.

Figure 2A:
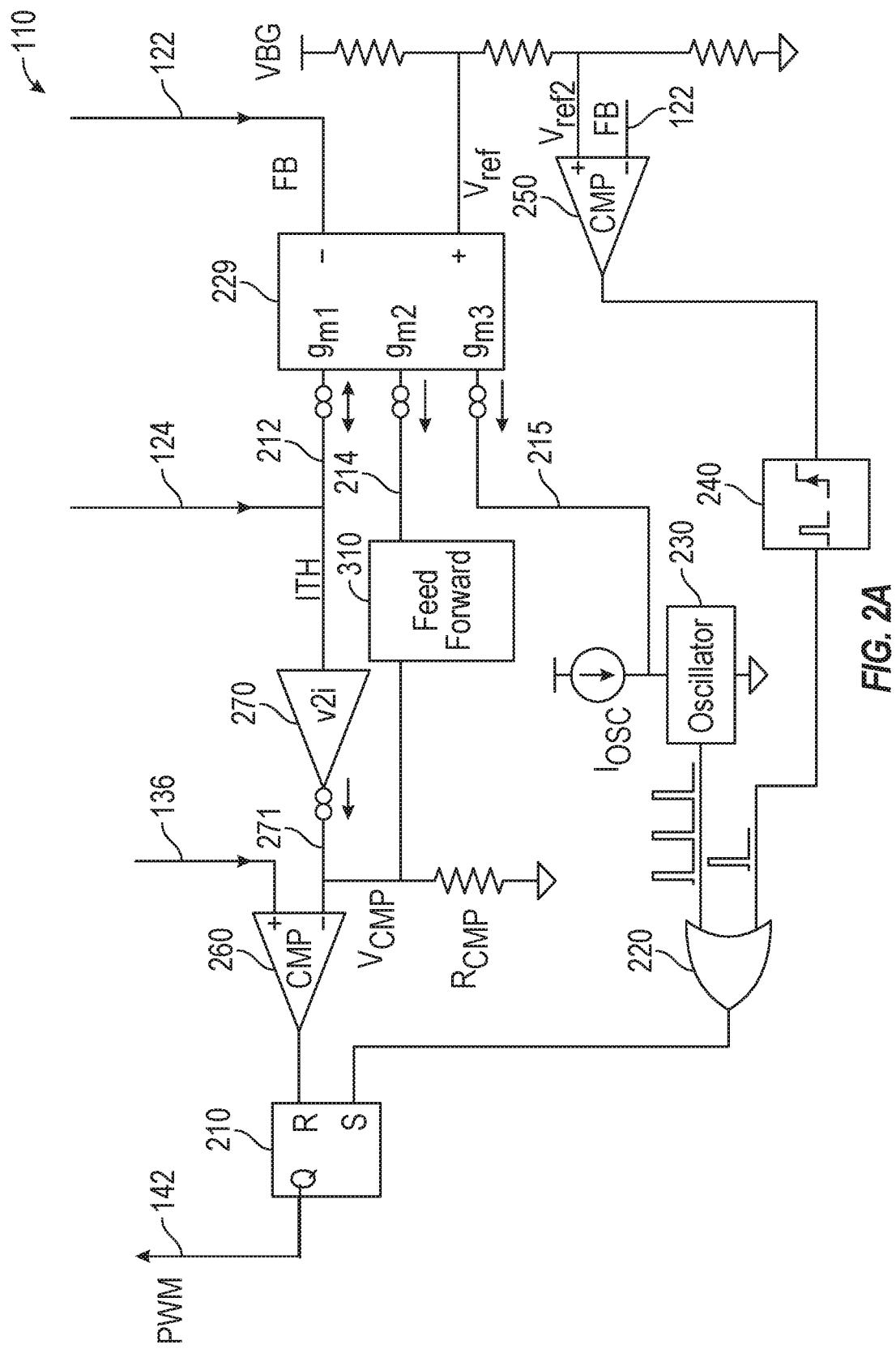
FIG. 2A is a block diagram of an example of a control circuit of the switching regulator system in accordance with various embodiments.

FIG. 2A is a block diagram of an example of a control circuit 110 in accordance with various embodiments. The elements that make up main control circuitry 140 of the control circuit 110 include a voltage divider configured to generate a regulation target voltage $V_{ref}$, a main error amplifier gm1 branch output 212 of a transconductance error amplifier 229, a voltage-to-current converter 270 (v2i which is a high-impedance input circuit), a first comparator 260 (e.g., a current comparator that outputs logic values), an RS latch 210, and the oscillator 230. The elements that make up transient handling circuitry 120 of the control circuit 110 include gm2 branch output 214 of the transconductance error amplifier 229, gm3 branch output 215 of the transconductance error amplifier 229, feedforward circuit 310 that passes current from the gm2 branch output 214 during a transient and prevents passing the current from the gm2 branch otherwise, a voltage divider configured to generate a second reference voltage $V_{ref2}$, a comparator 250, and a rising edge detector 240. Any element that is included in the transient handling circuitry 120 can be shared with or alternatively included in the main control circuitry 140. These elements are drawn as being separated into the main control circuitry 140 and the transient handling circuitry 120 for ease of reference and explanation of this disclosure.

In some embodiments, the error amplifier 229 includes a first error amplifier (e.g., a transconductance amplifier) that provides a main error gm1 branch output 212. The first error amplifier gm1 sources a current, which is proportional to the error between feedback voltage 122 (FB) and regulation target voltage Vref, to the compensation network 138. The voltage signal across the compensation network 138 is ITH. The ITH voltage feeds to a voltage-to-current converter 270, and its current output is fed to the $R_{CMP}$ to generate $V_{CMP}$. $V_{CMP}$ is the current reference signal, which is derived from ITH.

A constant current Iosc biases the oscillator to generate a constant frequency clock signal, which is coupled to the set input of the RS latch 210 to set the RS latch 210 and initiates a PWM signal 142. The current sensed Vsns voltage signal 136 is compared with the $V_{CMP}$ current signal using the first comparator 260, and the output of the first comparator 260 is coupled to the reset input of the RS latch 210 to reset the PWM signal 142. PWM signal 142 feeds the gate drivers, which turn on/off the power switches of the power stage 130.

Since the inductor 131 current follows the current reference, it acts as a controlled current source. The "set" signal sets the RS latch 210 and the PWM signal 142 becomes high. It stays high until Vsns matches the $V_{CMP}$ as determined by the first comparator 260. The PWM signal 142 stays low until it is set high by the next clock pulse.

The error amplifier gm1 branch output 212 provides a bidirectional current proportional to the error between regulation target Vref and the feedback voltage 122 (FB). The transconductance amplifier of the error amplifier 229 has two more output branches gm2 and gm3, labeled 214 and 215, respectively, which can be unidirectional current sources or bidirectional current sources. The feedforward circuit 310 is configured to only pass the current from the gm2 branch output 214 from the transconductance error amplifier 229 to resistor $R_{CMP}$ during load step-up transient and blocks the current from the gm2 branch output 214 during steady state operation. Under a load transient condition, the control loop momentarily diminishes the low-pass filter effect of the compensation network 138 so that the response is faster, but the steady state loop gain is not impacted. The gm3 branch output 215 from the transconductance error amplifier 229 is summed with the bias current of oscillator 230 Iosc. This causes additional current to be provided to the oscillator 230 to increase its output frequency.

When the converter operates around the equilibrium point, as the feedforward circuit 310 blocks the current from the gm2 branch output 214 from the transconductance error amplifier 229, the additional current from the gm2 branch output 214 to the compensation network 138 is inactive. When the load step transient occurs, the feedback voltage 122 (FB) deviates from Vref. The current from the gm2 branch output 214 sums with the current from the main error gm1 branch output 212 of the transconductance error amplifier 229 and exhibits a higher gain, compared with steady state. For example, the main error gm1 branch output 212 current feeds to compensation network 138, and the voltage across the compensation network 138 is converted as a current by the voltage-to-current converter 270. The current from the feedforward circuit 310 (e.g., the current from the gm2 branch output 214) is summed with the current from voltage-to-current converter 270 at a resistor $R_{CMP}$ to generate a compensation voltage $V_{CMP}$. The compensation voltage $V_{CMP}$ is compared by the first comparator 260 with the Vsns signal 136 received from the power stage 130. The output of the first comparator 260 is coupled to the reset input of the RS latch 210 to reset the PWM signal 142 when the Vsns signal 136 exceeds $V_{CMP}$. By adding an additional feedforward current to $R_{CMP}$, the closed-loop bandwidth of the switching regulator system 100 changes (e.g., increases) during a transient event. In the meantime, the current from gm3 branch output 215 adds to the bias current of oscillator 230 and accelerates the switching frequency of the converter momentarily.

The second comparator 250 is coupled to the rising edge detector 240. At the moment feedback voltage 122 (FB) falls below a second reference voltage (e.g., Vref2), which is slightly below the regulation target voltage Vref, the rising edge detector 240 generates an asynchronous pulse to set the RS latch 210. As an example, the output of the rising edge detector 240 is logically combined (e.g., through a logic OR element 220) with the output of the oscillator 230. Whichever one of the oscillator 230 or the output of the rising edge detector 240 goes high first sets the PWM signal 142 through the set input of the RS latch 210. Namely, pulse from the rising edge detector 240 is provided asynchronously and independently from the oscillator 230 to the set input of the RS latch 210 which turns ON the control switch immediately once the transient is detected. The clock latency is shortened so that the transient deviation is suppressed. Namely, the control switch is turned ON before the next clock cycle of the oscillator 230. While steady state is not yet reached, the higher than steady-state clock signal generated by the oscillator 230 based on the current from gm3 branch output 215 is passed through the logic OR element 220 to control the set input of the RS latch 210 at a higher frequency and generate the PWM signal 142 after the asynchronous pulse sets the RS latch 210. During normal operation, the rising edge detector 240 does not provide a pulse or a high signal, which means all of the outputs or the clock signal generated by the oscillator 230 pass through the logic OR element 220 to control the set input of the RS latch 210 and generate the PWM signal 142.

As the output voltage recovers, the current from gm3 branch output 215 smoothly reduces to zero, so the switching frequency gradually reduces and finally settles at the frequency of normal steady-state operation.

Figure 2B:
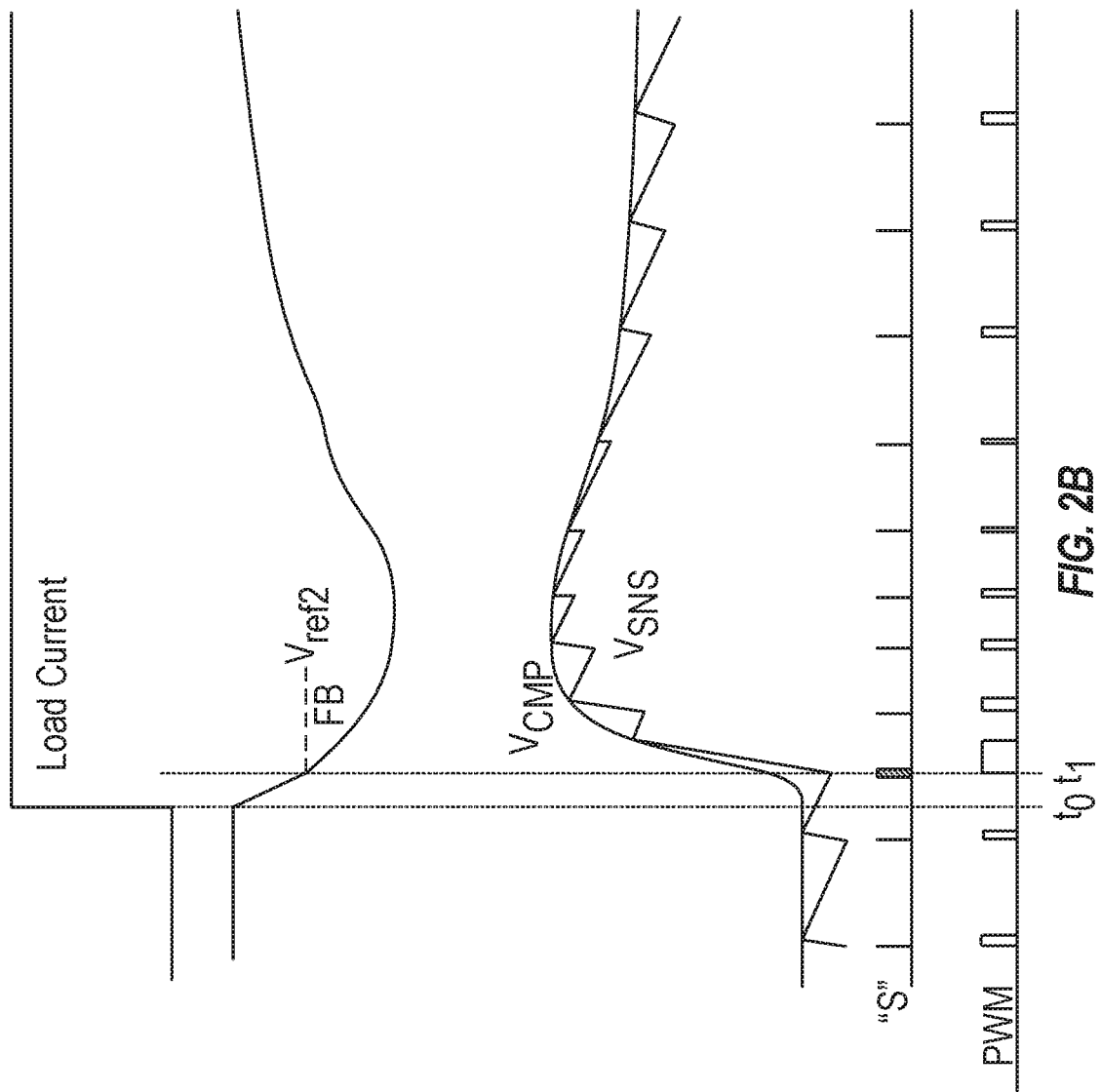
FIG. 2B is a load step-up transient response of the switching regulator system in accordance with various embodiments.

FIG. 2B is a load step-up transient response of the switching regulator system 100 in accordance with various embodiments. At $t_0$, the load steps up and feedback voltage 122 (FB) drops. At $t_1$, the feedback voltage 122 (FB) drops below the second reference voltage Vref2 so that the rising edge detector 240 generates a pulse to set the PWM signal 142 high before the next clock from the oscillator 230 is received. As the feedback voltage 122 (FB) is reduced during the transient event, the oscillator 230 receives more current from gm3 branch output 215 and oscillates faster. The oscillator 230 gradually recovers to generate a steady-state frequency as the feedback voltage 122 (FB) is recovered (reaches the value of the regulation target voltage Vref).

Figure 3:
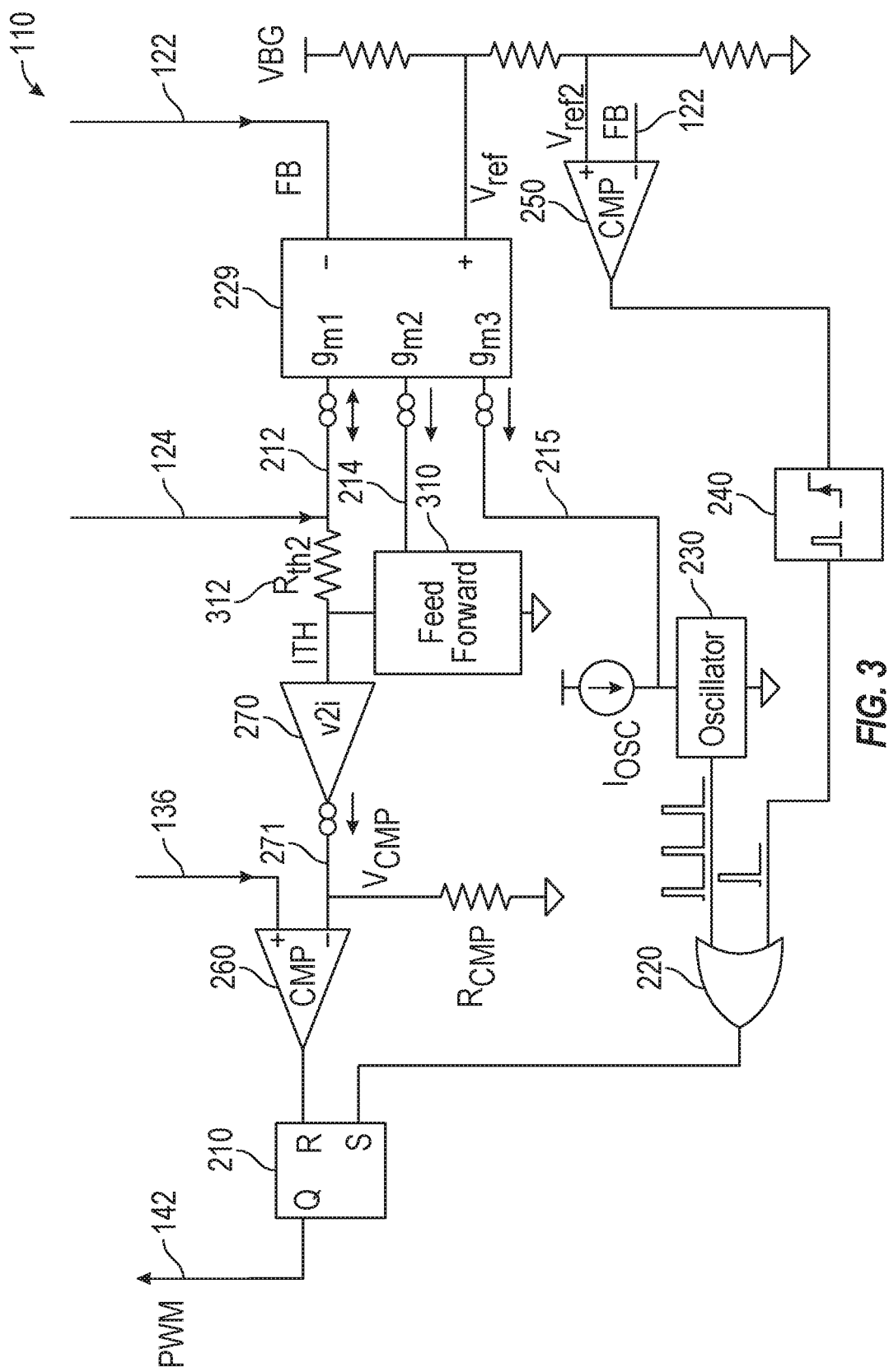
FIG. 3 is a block diagram of another example of a control circuit of the switching regulator system in accordance with various embodiments.

FIG. 3 is a block diagram of another example of a control circuit 110 of the switching regulator system 100 in accordance with various embodiments. The control circuit 110 shown in FIG. 3 includes similar components as control circuit 110 shown in FIG. 2 and such components operate in a similar manner.

As shown in FIG. 3, rather than the output of the feedforward circuit 310 being coupled to the output of the voltage-to-current converter 270, the output of the feedforward circuit 310 is coupled to the input of the voltage-to-current converter 270. In this sense, the current from the gm2 branch output 214 passes through a resistor 312 Rth2, which adds an additional feedforward voltage on top of the voltage across the compensation network Rth Cth Cthp. The summed voltage is ITH. Namely, the feedforward circuit 310 passes the current from gm2 branch output 214 to the ITH node during a transient. This summed voltage ITH is then provided through the voltage-to-current converter 270 to generate the $V_{CMP}$ signal that is compared by the first comparator 260 with the Vsns voltage signal 136 to control the reset input of the RS latch 210. As a result, during transient, the gain is higher than steady state. As discussed above, when no transient is detected, the feedforward circuit 310 blocks the current from gm2 branch output 214 from being passed through and summed with the current from the gm1 branch output 212.

Figure 4A:
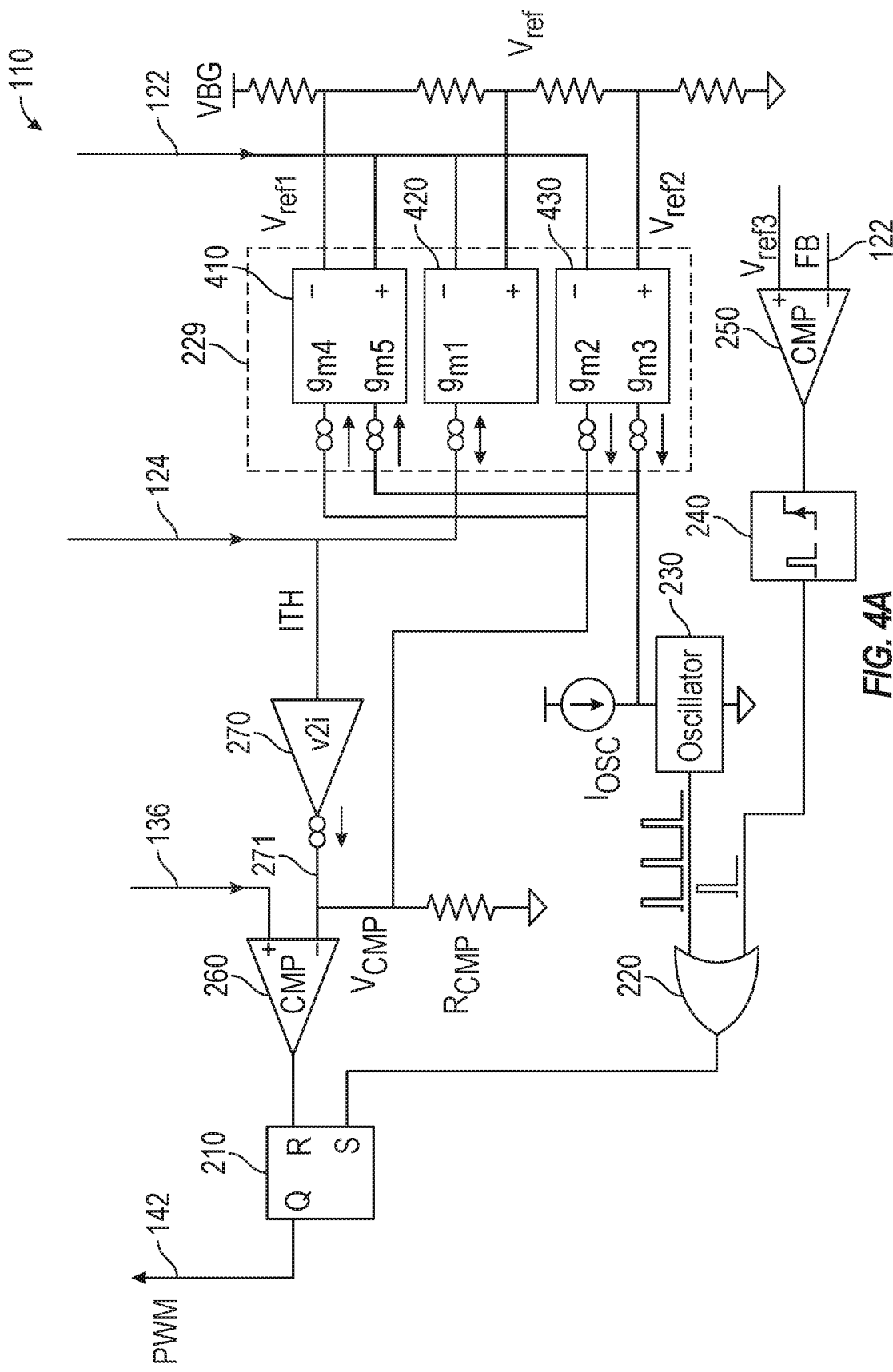
FIGS. 4A and 4B are block diagrams of other examples of a control circuit of the switching regulator system in accordance with various embodiments.

FIG. 4A is a block diagram of another example of a control circuit 110 of the switching regulator system 100 in accordance with various embodiments. The control circuit 110 shown in FIG. 4A includes similar components as control circuit 110 shown in FIG. 2 and such components operate in a similar manner.

A third transconductance amplifier 430 connects its non-inverting input to a second reference voltage Vref2, which is slightly lower than the regulation target voltage Vref. The inverting input of the third transconductance amplifier 430 is the feedback voltage 122 (FB). This third transconductance amplifier 430 has two unidirectional current sourcing output branches gm2 and gm3. A first transconductance amplifier 410 connects its inverting input to a first reference voltage Vref1, which is slightly higher than the regulation target voltage Vref. The non-inverting input is feedback voltage 122 (FB). This first transconductance amplifier 410 has two unidirectional sinking output branches gm4 and gm5.

The current outputs of branches gm3 and gm5 connect to the oscillator 230, while the gm2 and gm4 branch currents are summed with the ITH derived current at the comparator 260 (e.g., a current comparator) by the resistor $R_{CMP}$. When the converter operates around equilibrium point, feedback voltage 122 (FB) is higher than the second reference voltage Vref2 and lower than first reference voltage Vref1, so that the gm2-gm5 branch currents are inactive. When the load step occurs, the feedback voltage 122 (FB) voltage drops below the second reference voltage Vref2 or overshoots above the first reference voltage Vref1. The currents from the gm2 or gm4 branches increase the transient response by feeding forward a current signal to $V_{CMP}$. The low-pass filter (e.g., compensation network 138) coupled to generate signal 124 is bypassed under a transient, but still works in steady state to attenuate the noise at VIE and reduce the littering of PWM signal 142. The third reference voltage Vref3 is below the regulation target voltage Vref.

At the moment feedback voltage 122 (FB) falls below third reference voltage Vref3, an asynchronous pulse is generated by the rising edge detector 240. This asynchronous pulse sets the RS latch 210 before the next clock cycle of the oscillator 230. The currents from the gm3 branch (similar to the current from the gm3 branch output 215 (FIG. 2A)) add to the bias current of the oscillator 230 and accelerate the switching frequency of the converter momentarily during the transient.

Figure 4B:
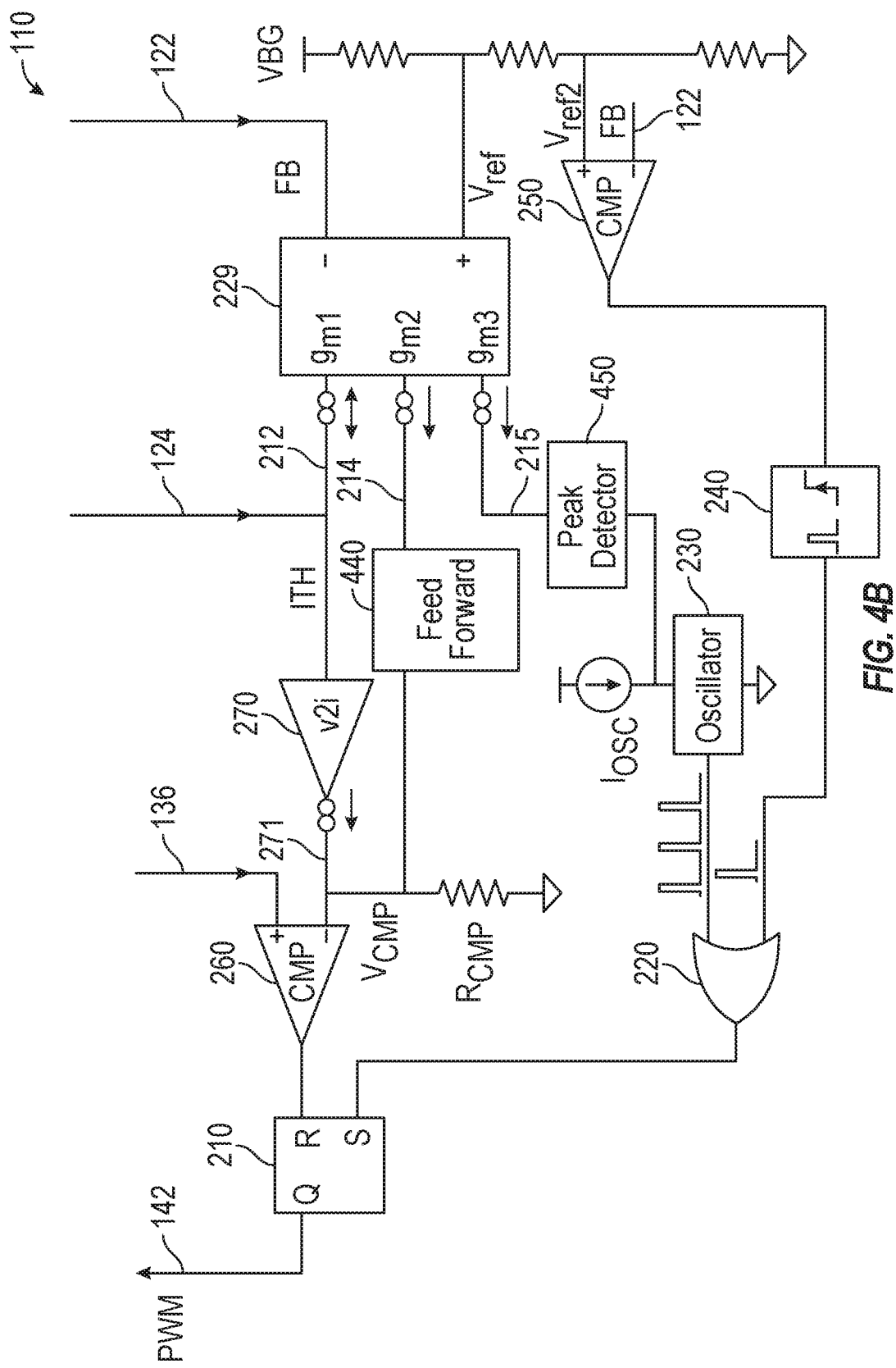

FIG. 4B is a block diagram of another example of a control circuit 110 of the switching regulator system 100 in accordance with various embodiments. The control circuit 110 shown in FIG. 413 includes similar components as control circuit 110 shown in FIG. 2 and such components operate in a similar manner.

The control circuit 110 shown in FIG. 4B includes a peak detector 450 on the path from the gm3 branch output 215 to the oscillator 230. The peak detector 450 feeds a current to oscillator 230, which tracks the gm3 branch output 215 current when it increases, and this current gradually decays if the gm3 branch output 215 current decreases.

The control circuit 110 shown in FIG. 413 includes a feedforward circuit 440 which selectively passes or does not pass the current from the gm2 branch output 214 to be summed with the current from the main branch output 212 that is derived from the ITH signal by the voltage-to-current converter 270. The feedforward circuit 440 passes the current from the gm2 branch output 214 when a transient is detected and does not pass the current from the gm2 branch output 214 during steady state operations. By passing current from the gm2 branch output 214 directly during a transient, the Vcmp signal immediately reflects the change in the feedback voltage 122 (FB) without having to encounter and wait for the delay in generating the FM signal using the compensation network 138.

Figure 4C:
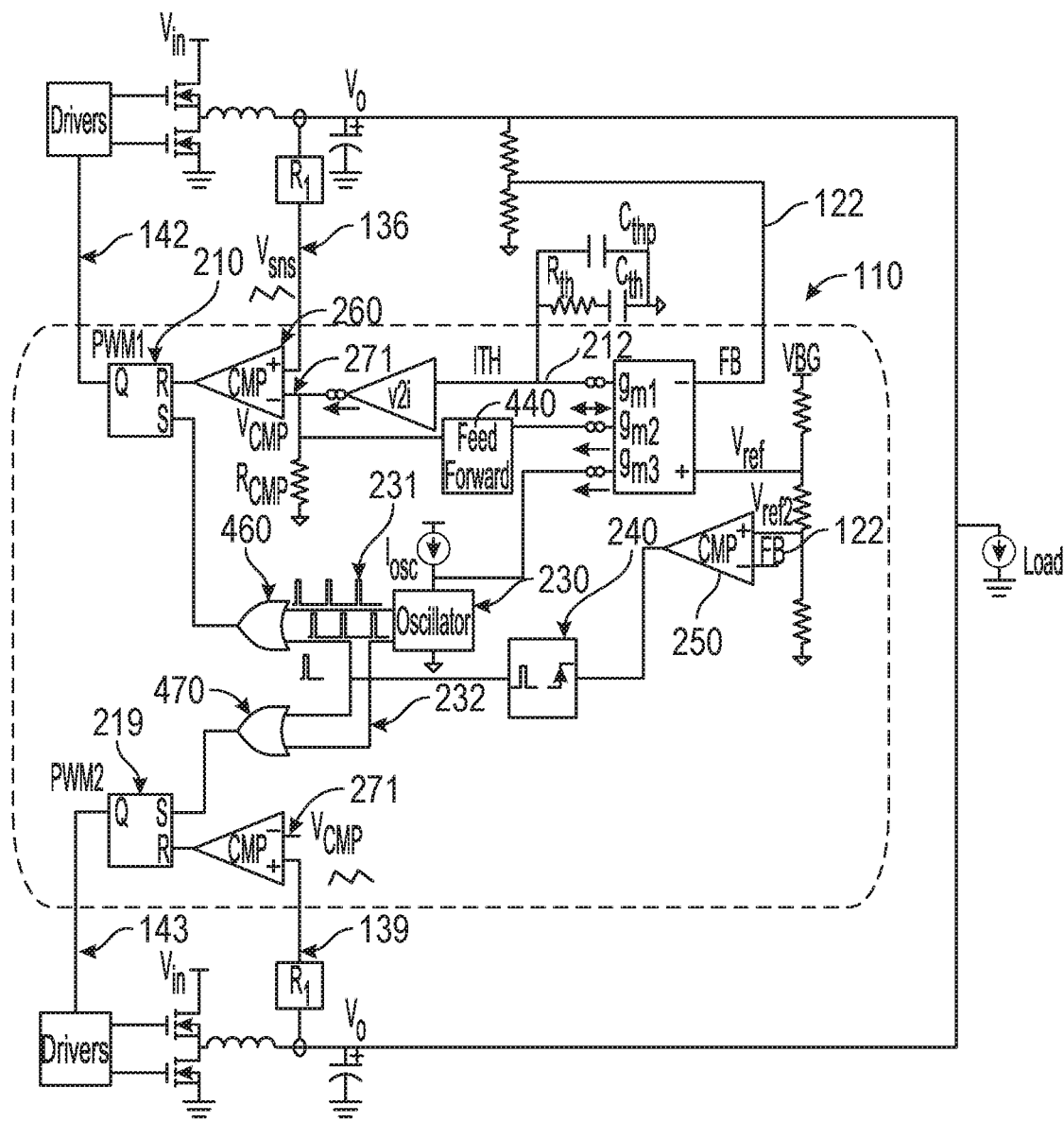
FIG. 4C is a block diagram of an example of a multiphase shared output converter in accordance with various embodiments.

FIG. 4C is a block diagram of an example of a multiphase shared output converter in accordance with various embodiments. The components shown in FIG. 4C are similar to those shown in FIGS. 1 and 2A and such components operate in a similar manner. As an example of multiphase converter, the dual-phase shared output converter shown in FIG. 4C includes two paths to drive a load in two phases. A first path drives the load by operating a first instance of power stage 130 with a first PWM signal 142 generated using a first RS latch 210. A second path drives the load by operating a second instance of power stage 130 with a second PWM signal 143 generated using a second RS latch 219. The second PWM signal 143 may be out of phase relative to the first PWM signal 142 but may also be in-phase in some cases. While only two phases and paths are discussed, any number of additional phases (e.g., 2-N) can be included and addressed in a similar manner.

The oscillator 230 generates multiple out-phase (or in-phase) clock signals 231 and 232 each configured to set a respective RS latch 210 and 219 of each phase of the multiphase shared output converter. As shown, a first clock signal 231 is provided through a first logic OR element 460 to the first RS latch 210. The first logic OR element 460 logically combines the first clock signal 231 with an asynchronous pulse signal generated by rising edge detector 240 when a transient is detected. As a result, the set input of the first RS latch 210 is set whenever either the first clock signal 231 is high or the pulse is generated by the rising edge detector 240. A second clock signal 232 is provided through a second logic OR element 470 to the second RS latch 219. The second logic OR element 470 logically combines the second clock signal 232 with the asynchronous pulse signal generated by rising edge detector 240 when the transient is detected. As a result, the set input of the second RS latch 219 is set whenever either the second clock signal 232 is high or the pulse is generated by the rising edge detector 240.

In steady state operation, the PWM1 and PWM2 signals 142 and 143 are interleaving. When the feedback voltage 122 (FB) falls below a second reference voltage Vref2, the asynchronized pulse generated by the rising edge detector 240 sets both RS latches 210 and 219 at the same time. This causes the PWM pulses of PWM1 and PWM2 signals 142 and 143 of phase 1 and phase 2 to overlap. This helps to accelerate the power delivery to the output. The $V_{CMP}$ voltage signal 271 is shared by both phases. The first phase uses the comparator 260 to compare the $V_{CMP}$ voltage signal 271 to the Vsns signal 136 to reset the first RS latch 210 when the Vsns signal 136 exceeds the $V_{CMP}$ voltage signal 271. The second phase generates a Vsns voltage signal 139 when a switch in the power stage turns ON, ramping down the current which flows through a current sensor $R_1$. The second phase uses another instance of comparator 260 to compare the $V_{CMP}$ voltage signal 271 to the Vsns voltage signal 139 to reset the second RS latch 219 when the Vsns voltage signal 139 exceeds the $V_{CMP}$ voltage signal 271.

The gm3 branch output 215 adds additional current to operate the oscillator 230 at a higher frequency during a load step-up transient, resulting in both out-of-phase clock signal frequencies to be increased. Namely, during a transient, each of the first and second power stage instances are initially triggered to switch ON a switch to charge respective inductors based on the asynchronously generated pulse at the same time. Also, during the transient, each of the first and second power stage instances operates using a higher frequency clock signal that gradually decreases in frequency based on a difference between the feedback voltage 122 (FB) and the regulation target voltage Vref.

FIG. 5 is a flow diagram depicting an example process 500 for controlling switching operations of a switching regulator in accordance with various embodiments. The operations of the process 500 may be performed in parallel or in a different sequence, or may be entirely omitted. In some embodiments, some or all of the operations of the process 500 may be embodied on a computer-readable medium and executed by one or more processors.

At operation 510, the power stage 130 generates, using the inductor 131, an output voltage signal from a PWM signal by controlling one or more switches of a switching regulator that vary charging operations of the inductor 131. For example, the power stage 130 uses the inductor 131 to generate an output voltage Vo by controlling switches 132 and 133 based on PWM signal 142.

At operation 520, the transient handling circuitry 120 generates first and second current signals that represent a difference between a feedback voltage, generated based on the output voltage signal, and a reference voltage. For example, the transient handling circuitry 120 generates signals 126 that are provided to the main control circuitry 140. The signals 126 include currents from branches gm1, gm2, and gm3 outputs 212, 214, and 215 of one or more transconductance error amplifiers 229.

At operation 530, the main control circuitry 140 changes a frequency of an oscillator used to generate the PWM signal as a function of the first current signal and changes a bandwidth of a feedback loop associated with the switching regulator as a function of the second current signal to generate the PWM signal. For example, the PWM signal 142 is generated based on the oscillator 230 frequency being increased and gradually decreased based on the gm3 branch output 215, and the bandwidth of the feedback loop associated with the regulator system 100 changes based on the current from the gm3 branch output 214 summing with a current derived from the gm1 branch output 212 during a transient.

Figure 6:
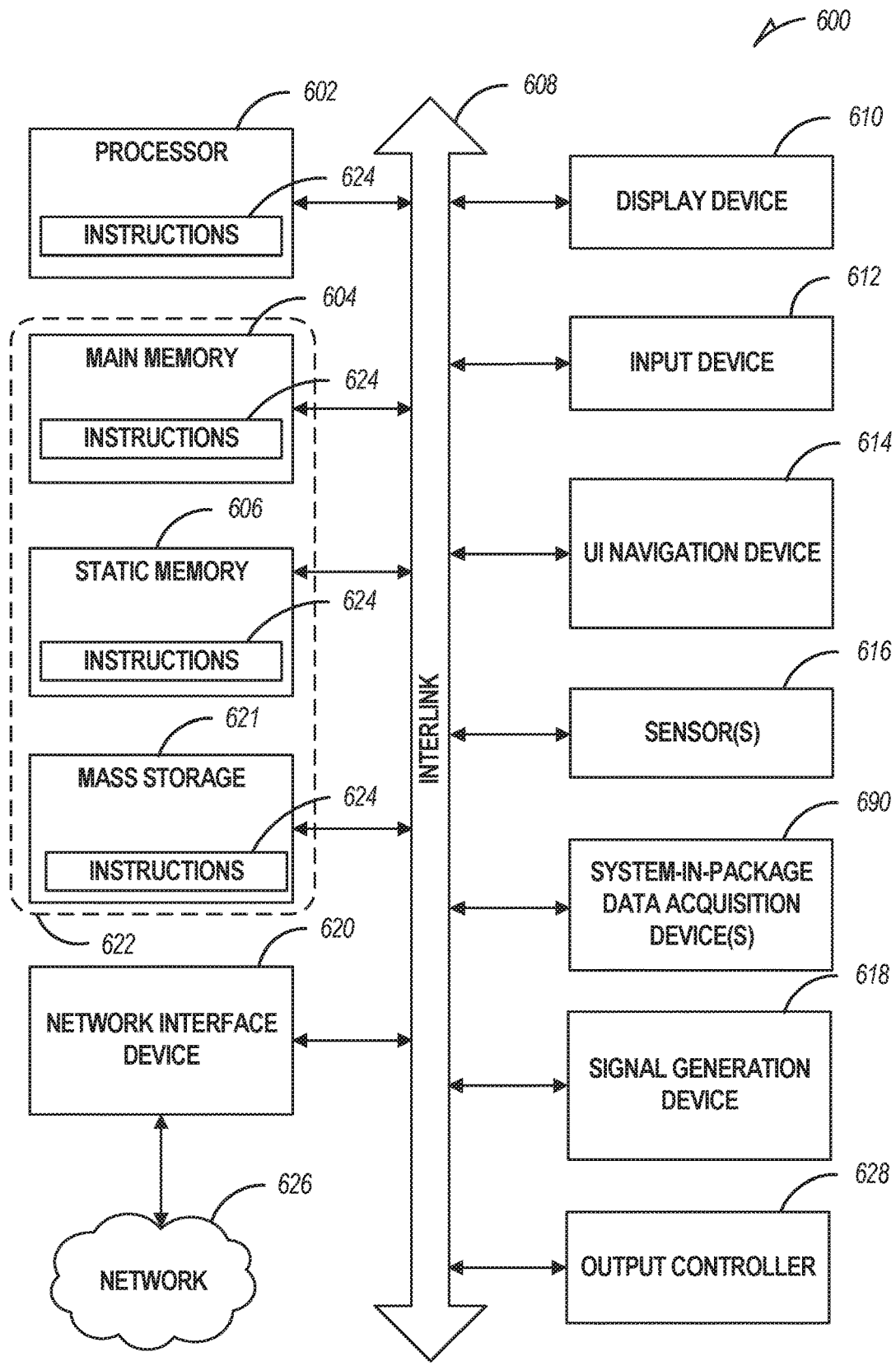
FIG. 6 is a block diagram illustrating an example of a machine upon which one or more embodiments may be implemented.

FIG. 6 is a block diagram of an example machine 600 upon which any one or more of the techniques (e.g., methodologies) discussed herein may be performed. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in a peer-to-peer (P2P) (or other distributed) network environment. The machine 600 may be a personal computer (PC), a tablet PC, a set-top box (STB), a personal digital assistant (PDA), a mobile telephone, a web appliance, an IoT device, an automotive system, an aerospace system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant-massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 600 may include a hardware processor 602 (e.g., a central processing unit (CPU), a graphics processing unit (GPU), a hardware processor core, or any combination thereof, such as a memory controller, etc.), a main memory 604, and a static memory 606, some or all of which may communicate with each other via an interlink (e.g., bus) 608. The machine 600 may further include a display device 610, an alphanumeric input device 612 (e.g., a keyboard), and a user interface (UI) navigation device 614 (e.g., a mouse). In an example, the display device 610, alphanumeric input device 612, and UI navigation device 614 may be a touchscreen display. The machine 600 may additionally include a storage device 622 (e.g., drive unit); a signal generation device 618 (e.g., a speaker); a network interface device 620; one or more sensors 616, such as a Global Positioning System (GPS) sensor, wing sensors, mechanical device sensors, temperature sensors, ICP sensors, bridge sensors, audio sensors, industrial sensors, a compass, an accelerometer, or other sensors; and one or more system-in-package data acquisition devices 690. The system-in-package data acquisition device(s) 690 may implement some or all of the functionality of the switching regulator system 100. The machine 600 may include an output controller 628, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The storage device 622 may include a machine-readable medium on which is stored one or more sets of data structures or instructions 624 (e.g., software) embodying or utilized by any one or more of the techniques or functions described herein. The instructions 624 may also reside, completely or at least partially, within the main memory 604, within the static memory 606, or within the hardware processor 602 during execution thereof by the machine 600. In an example, one or any combination of the hardware processor 602, the main memory 604, the static memory 606, or the storage device 622 may constitute the machine-readable medium.

While the machine-readable medium is illustrated as a single medium, the term "machine-readable medium" may include a single medium or multiple media (e.g., a centralized or distributed database, or associated caches and servers) configured to store the one or more instructions 624.

The term "machine-readable medium" may include any transitory or non-transitory medium that is capable of storing, encoding, or carrying transitory or non-transitory instructions for execution by the machine 600 and that cause the machine 600 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data that are stored on the storage device 621 can be accessed by the main memory 604 for use by the hardware processor 602. The main memory 604 (e.g., DRAM) is typically fast, but volatile, and thus a different type of storage from the storage device 621 (e.g., an SSD), which is suitable for long-term storage, including while in an "off" condition. The instructions 624 or data in use by a user or the machine 600 are typically loaded in the main memory 604 for use by the hardware processor 602. When the main memory 604 is full, virtual space from the storage device 621 can be allocated to supplement the main memory 604; however, because the storage device 621 is typically slower than the main memory 604, and write speeds are typically at least twice as slow as read speeds, use of virtual memory can greatly reduce user experience due to storage device latency (in contrast to the main memory 604, e.g., DRAM). Further, use of the storage device 621 for virtual memory can greatly reduce the usable lifespan of the storage device 621.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone Service (POTS) networks, and wireless data networks (e.g., Institute of Electrical and Electronics Engineers (IEEE) 802.11 family of standards known as Wi-Fi®, IEEE 802.16 family of standards known as WiMax®, IEEE 802.15.4 family of standards, peer-to-peer (P2P) networks), among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIM), multiple-input multiple-output (MIMO), or multiple-input single-output (MISO) techniques. The term "transmission medium" shall be taken to include any tangible or intangible medium that is capable of storing, encoding, or carrying instructions for execution by the machine 600, and includes digital or analog communications signals or other tangible or intangible media to facilitate communication of such software.

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended; that is, a system, device, article, composition, formulation, or process that includes elements in addition to those listed after such a term in a claim are still deemed to fall within the scope of that claim. Moreover, in the following claims, the terms "first," "second," "third," etc. are used merely as labels, and are not intended to impose numerical requirements on their objects.

Method examples described herein may be machine- or computer-implemented at least in part. Some examples may include a computer-readable medium or machine-readable medium encoded with transitory or non-transitory instructions operable to configure an electronic device to perform methods as described in the above examples. An implementation of such methods may include code, such as microcode, assembly-language code, a higher-level-language code, or the like. Such code may include transitory or non-transitory computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read-only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 CFR. § 1.72(b), to allow the reader to quickly ascertain the nature of the technical disclosure. It is submitted with the understanding that it will not be used to interpret or limit the scope or meaning of the claims. Also, in the above detailed description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the detailed description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

What is claimed is:

1. A system for controlling switching operations of a switching regulator, the system comprising:
   the switching regulator configured to use an inductor to generate an output voltage signal from a pulse-width-modulated (PWM) signal by controlling one or more switches of the switching regulator that vary charging operations of the inductor;
   transient handling circuitry coupled to receive a feedback voltage based on the output voltage signal and configured to generate first, second and third current signals that represent one or more differences between the feedback voltage and a reference voltage, the third current signal being used to generate a compensation voltage; and
   control circuitry configured to generate the PWM signal based on the first and second current signals and based on the compensation voltage such that the first current signal changes a frequency of an oscillator used to generate the PWM signal and the second current signal changes a bandwidth of a feedback loop associated with the switching regulator, the PWM signal being generated based on an intersection between the compensation voltage and a voltage sense signal representing inductor current.

2. The system of claim 1, wherein the switching regulator comprises a peak current-mode control circuit, wherein after a load step-up event, the first current signal initially increases the frequency of the oscillator and gradually decreases the frequency of the oscillator as the feedback voltage reaches the reference voltage.

3. The system of claim 1, wherein the control circuitry is further configured to:
   convert the third current signal to the compensation voltage; and
   compare, using a comparator, the compensation voltage to the voltage sense signal representing inductor current.

4. The system of claim 1, wherein the second current signal is summed with the third current signal.

5. The system of claim 4, wherein the control circuitry is further configured to:

pass the second current signal during a transient; and
sum the passed second current signal with a current derived from the compensation voltage.

6. The system of claim 5, wherein the summed second current signal with the current derived from the compensation voltage generates a second compensation voltage to generate the PWM signal.

7. The system of claim 6, wherein the control circuitry comprises a reset-set (RS) latch circuit, wherein an output of a current comparator that compares the second compensation voltage with the voltage sense signal is coupled to a reset input of the RS latch circuit, and wherein the oscillator is coupled to a set input of the RS latch circuit.

8. The system of claim 1, wherein the control circuitry is further configured to generate an asynchronous pulse signal to control the PWM signal, the asynchronous pulse signal being generated based on a comparison between the feedback voltage and a second reference voltage.

9. The system of claim 8, wherein the control circuitry comprises a rising edge detector to generate the asynchronous pulse signal.

10. The system of claim 8, wherein a frequency signal generated based on the oscillator and the asynchronous pulse signal is coupled to a set input of an RS latch circuit.

11. The system of claim 10, wherein the frequency signal is generated based on an output of a logical OR circuit that logically combines the oscillator and the asynchronous pulse signal.

12. The system of claim 1, wherein the first current signal is provided to a peak detector, an output of the peak detector being used to change the frequency of the oscillator.

13. The system of claim 1, wherein the switching regulator comprises a multiphase shared output converter, wherein the PWM signal is a first PWM signal provided to the multiphase shared output converter, wherein the control circuitry provides a second PWM signal to the multiphase shared output converter, and wherein the first current signal increases the frequency of the oscillator used to generate the first PWM signal and the second PWM signal.

14. The system of claim 13, wherein the control circuitry is further configured to generate an asynchronous pulse signal to concurrently set both the first and second PWM signals, the asynchronous pulse signal being generated based on a comparison between the feedback voltage and a second reference voltage.

15. A method comprising:
   generating, using an inductor, an output voltage signal from a pulse-width-modulated (PWM) signal by controlling one or more switches of a switching regulator that vary charging operations of the inductor;
   generating, by transient handling circuitry, first, second and third current signals that represent one or more differences between a feedback voltage, generated based on the output voltage signal, and a reference voltage, the third current signal being used to generate a compensation voltage; and
   changing a frequency of an oscillator used to generate the PWM signal as a function of the first current signal and changing a bandwidth of a feedback loop associated with the switching regulator as a function of the second current signal to generate the PWM signal, the PWM signal being generated based on the compensation voltage, the PWM signal being generated based on an intersection between the compensation voltage and a voltage sense signal representing inductor current.

16. The method of claim 15, wherein the switching regulator comprises a peak current-mode control circuit, wherein after a load step-up event, the first current signal initially increases the frequency of the oscillator and gradually decreases the frequency of the oscillator as the feedback voltage reaches the reference voltage.

17. The method of claim 15, further comprising:
converting the third current signal to the compensation voltage;
comparing, using a comparator, the compensation voltage to the voltage sense signal representing inductor current.

18. An apparatus comprising:
means for generating, using an inductor, an output voltage signal from a pulse-width-modulated (PWM) input voltage by controlling one or more switches of a switching regulator that vary charging operations of the inductor;
means for generating, by transient handling circuitry, first second and third current signals that represent one or more differences between a feedback voltage, generated based on the output voltage signal, and a reference voltage, the third current signal being used to generate a compensation voltage; and
means for changing a frequency of an oscillator used to generate the PWM signal as a function of the first current signal and changing a bandwidth of a feedback loop associated with the switching regulator as a function of the second current signal to generate the PWM signal, the PWM signal being generated based on the compensation voltage, the PWM signal being generated based on an intersection between the compensation voltage and a voltage sense signal representing inductor current.

19. The apparatus of claim 18, wherein the switching regulator comprises a peak current-mode control circuit, wherein after a load step-up event, the first current signal initially increases the frequency of the oscillator and gradually decreases the frequency of the oscillator as the feedback voltage reaches the reference voltage.

20. The apparatus of claim 18, further comprising:
means for converting the third current signal to the compensation voltage;
means for comparing, using a comparator, the compensation voltage to the voltage sense signal representing inductor current.

* * * * *

UNITED STATES PATENT AND TRADEMARK OFFICE
CERTIFICATE OF CORRECTION

PATENT NO. : 11,283,351 B2
APPLICATION NO. : 16/906519
DATED : March 22, 2022
INVENTOR(S) : Yan et al.

It is certified that error appears in the above-identified patent and that said Letters Patent is hereby corrected as shown below:

On the Title Page

Item (57), in "Abstract", in Column 2, Line 4, delete "a." and insert --a-- therefor In the Claims In Column 17, Line 18, in Claim 18, after "first", insert --,--

Signed and Sealed this
Seventeenth Day of May, 2022

Katherine Kelly Vidal
*Director of the United States Patent and Trademark Office*